United States Patent [19]

Maier

[11] Patent Number: 4,806,866
[45] Date of Patent: Feb. 21, 1989

[54] AUTOMATIC RF FREQUENCY ADJUSTMENT FOR MAGNETIC RESONANCE SCANNER

[75] Inventor: Joseph K. Maier, Milwaukee, Wis.

[73] Assignee: General Electric Company, Milwaukee, Wis.

[21] Appl. No.: 43,862

[22] Filed: Apr. 29, 1987

[51] Int. Cl.$^4$ .......................................... G01R 33/08
[52] U.S. Cl. .................................................. 324/313
[58] Field of Search .................. 324/313, 314, 311

[56] References Cited

U.S. PATENT DOCUMENTS

| | | | |
|---|---|---|---|
| 3,609,519 | 9/1971 | Seki | 324/313 |
| 4,171,511 | 10/1979 | Hill | 324/313 |
| 4,543,529 | 9/1985 | Mee | 324/313 |

OTHER PUBLICATIONS

"Operating the Signa System", Operator Manual, vol. 2, 1/30/85; Rev. 2.
"Patient Preparation and the MR Exam", Operator Manual, vol. 3, 6/13/86; Rev. 8.
"Operating The Signa ™ System", Operator Manual, vol. 2, 6/13/86; Rev. 10.

Primary Examiner—Jerry Smith
Assistant Examiner—Steven G. Kibby
Attorney, Agent, or Firm—Quarles & Brady

[57] ABSTRACT

An MR scanner performs a prescan before each MR scan sequence in which the optimal RF excitation frequency is automatically determined and applied to the scanner's transceiver. The prescan sequence includes a pair of MR measurements which provide data that allows the precise RF excitation frequency to be determined.

13 Claims, 6 Drawing Sheets

AUTOMATIC RF FREQUENCY ADJUSTMENT FOR MAGNETIC RESONANCE SCANNER

BACKGROUND OF THE INVENTION

This invention relates to magnetic resonance (MR) techniques. More specifically, this invention relates to the automatic adjustment of the RF transmitter and receiver to the optimal Larmor frequency. The invention is particularly applicable to magnetic resonance imaging, but is not limited thereto.

The magnetic resonance phenomenon has been utilized in the past in high resolution magnetic resonance spectroscopy instruments by structural chemists to analyze the structure of chemical compositions. More recently, MR has been developed as a medical diagnostic modality having applications in imaging the anatomy, as well as in performing in vivo, noninvasive spectroscopic analysis. As is now well known, the MR phenomenon can be excited within a sample object, such as a human patient, positioned in a homogeneous polarizing magnetic field, $B_o$, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or a different RF coil is used to detect the MR signals, frequently in the form of spin echoes, emanating from the patient lying within the field of the RF coil. In the course of a complete MR scan, a plurality of MR signals are typically observed. The MR signals are used to derive MR imaging or spectroscopic information about the patient being imaged or studied.

Before the commencement of each MR scan, it is common practice to adjust the frequency of the RF transmitter and receiver to insure that the excitation field is at the optimal Larmor frequency. This is necessary to produce the desired image contrast effects in certain MR measurements and to insure the accuracy of slice selection location. In a human subject, for example, the MR signal is produced primarily by the protons in water and fat molecules. The Larmor frequency of the protons in these two substances is slightly different and the Larmor frequency of both will vary slightly from patient to patient and at different locations within a patient due to inhomogeneities. In prior MR scanners, it is common practice to perform a calibration sequence in which an MR sequence is first executed and the MR signal is processed to produce on a CRT screen a picture of signal amplitude versus RF frequency. The operator then examines this picture and manually adjusts the frequency of the RF receiver to a desired value. For example, the displayed MR signal may show two peaks, one at the Larmor frequency for fat protons and one at the Larmor frequency for water protons. The operator may choose either frequency, or a frequency therebetween, depending on the particular MR measurement to be conducted.

SUMMARY OF THE INVENTION

The present invention is an improvement to an MR scanner in which the adjustment of the RF frequency is made automatically during a sequence performed just prior to each MR scan. More specifically, the MR scanner performs a first, wideband MR measurement in which the frequency of the highest peak in the MR signal is determined at the region of interest in the subject, the RF transmit and receive frequencies are set to this determined frequency, a second, narrowband MR measurement is made to obtain a second MR signal from the region of interest, the MR signal is analyzed to determine the frequencies of the fat and water peaks therein, and the frequency of the RF transmitter and RF receiver is set with respect to these determined frequencies.

A general object of the invention is to automatically adjust the RF frequency prior to each MR scan. The first and second MR measurements are performed in response to a stored program which carries out a number of other prescan calibration and adjustment functions. The MR signal from the second, narrowband MR measurement is processed and analyzed automatically under the direction of the same stored program and signals are output to the RF transmitter and RF receiver which control their frequency. The only operator input is an indication in the form of a manual selection of where with respect to the measured peak frequencies the transmitter and receiver frequencies are to be set.

Another object of the invention is to increase patient thru-put and decrease operator error. The measurement and adjustment sequence is performed quickly with little judgment or manually input information from the operator. In a preferred embodiment of the invention the operator need only select whether the RF frequency is to be set to the resonant frequency of fat or water, to the midpoint or centroid frequency, or to the highest of the peak frequencies. The rest is performed automatically.

Yet another object of the invention is to improve the quality of images produced by an MR scanner. The desired RF frequency can be determined more accurately with the present invention and the frequency can be tuned precisely for the particular region of interest in the patient to obtain the desired image contrast effects in that particular region.

Another object of the invention is to insure the accuracy of slice selection position within the region of interest. The location of the slice depends on the accuracy of the RF frequency, and by employing the calibration technique of the present invention, the position of the slice is also calibrated.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent a full scope of the invention, however, and reference is made therefore to the claims herein for interpreting the scope of the invention.

DETAILED DESCRIPTION OF THE INVENTION

Figure 1:
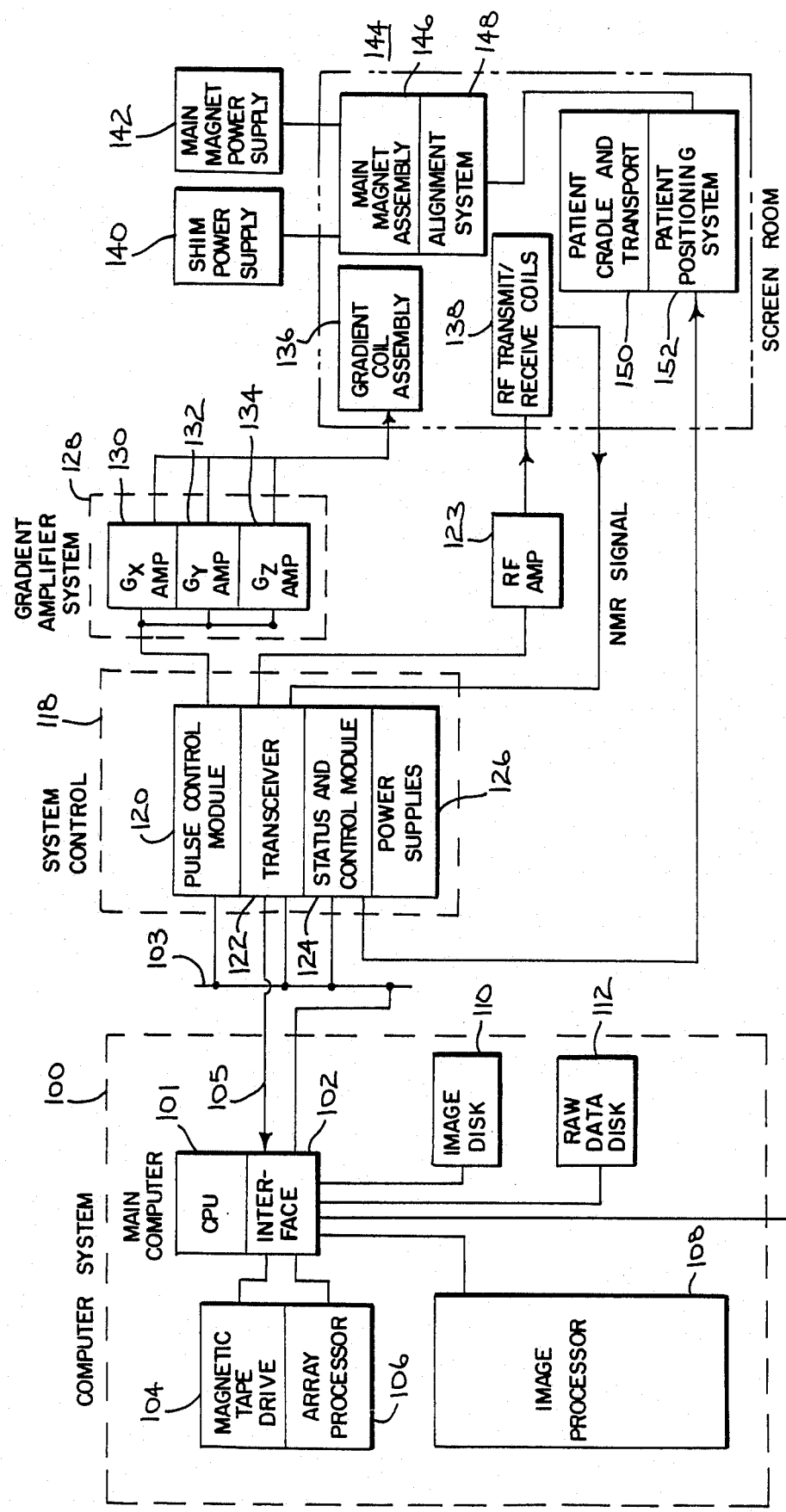
FIG. 1 is a block diagram of an MR system which employs the present invention.

Referring first to FIG. 1, there is shown in block diagram form the major components of a preferred MR system which incorporates the present invention and which is sold by the General Electric Company under the trademark "SIGNA." The overall operation of the system is under the control of a host computer system generally designated 100 which includes a main computer 101 (such as a Data General MV4000). The computer has associated therewith an interface 102 through which a plurality of computer peripheral devices and other MR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for preprocessing data and for image reconstruction. The function of image processor 108 is to provide interactive image display manipulation such as magnification, image comparison, gray-scale adjustment and realtime data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper MR system operation, such as calibrating, initiating and terminating scans. The operator console is also used to display images stored on discs or magnetic tape.

The computer system exercises control over the MR system by means of system control 118 and gradient amplifier system 128. The computer 100 communicates with system control 118 by means of a serial digital communication network 103 (such as the Ethernet network) in a manner well known to those skilled in the art. The system control 118 includes several subsystems such as the pulse control module (PCM) 120, a radio frequency transceiver 122, a status control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_o$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_o + G_x X + G_y Y + G_z Z$.

The gradient magnetic fields are utilized in combination with radio frequency pulses generated by transceiver 122, RF amp 128 and RF coil 138 to encode spatial information into the MR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coils 138 which are situated within main magnet assembly 146. The NMR signals radiated by the excited nuclei in the patient are sensed by the same or a different RF coil than is used for transmitting. The signals are detected, amplified, demodulated, filtered, and digitized in the receiver section of the transceiver 122. The processed signals are transmitted to the main computer 101 for processing by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as an Intel 8086) for processing commands from the main computer 101. The SCM 124 includes means for acquiring information regarding patient cradle position, and the position of the movable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the main magnet power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the MR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room. A bi-directional attenuation of approximately 100 db. is typical in the 63 MHz to 64 MHz frequency range of operation.

Figure 2:
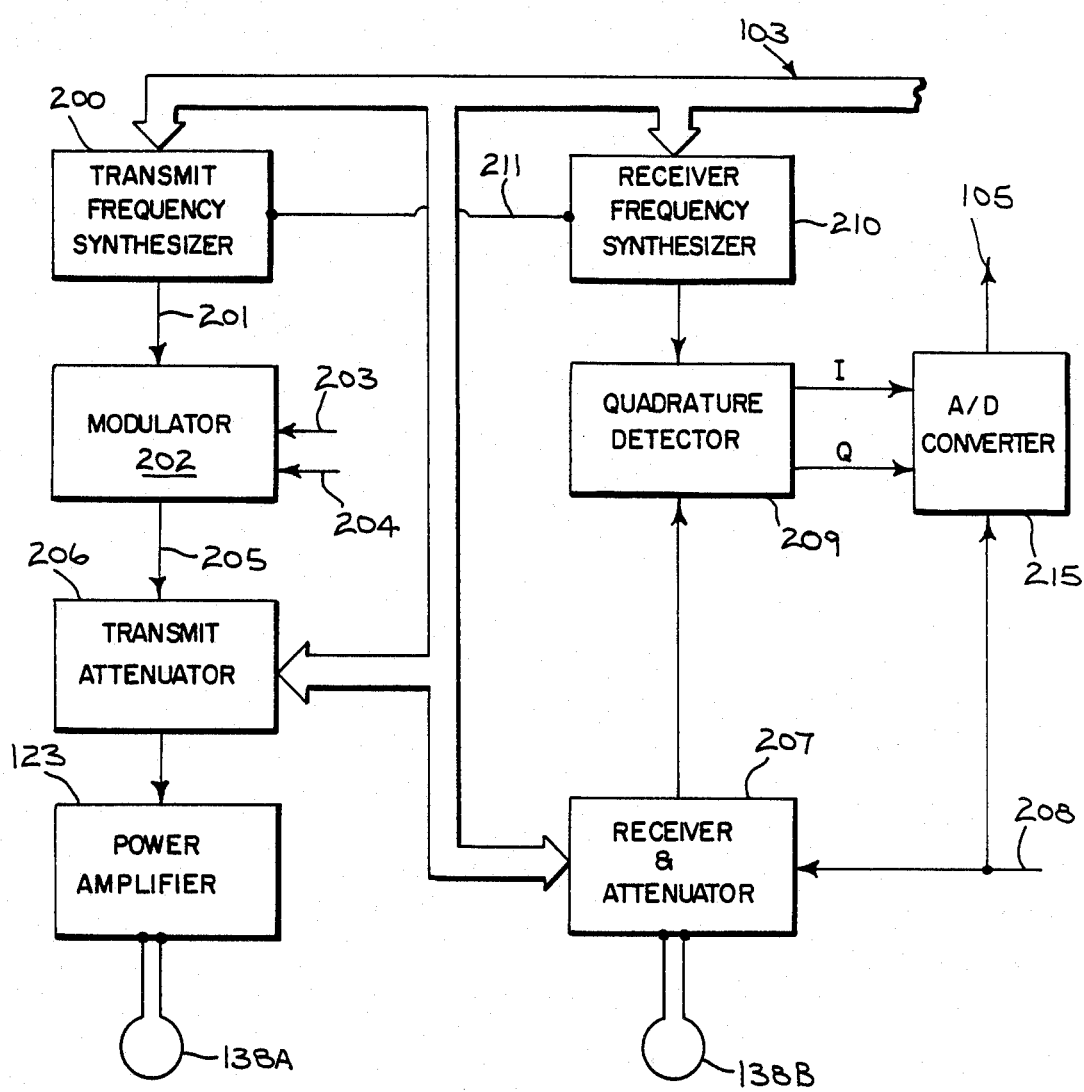
FIG. 2 is an electrical block diagram of the transceiver which forms part of the MR system of FIG. 1.

Referring particularly to FIGS. 1 and 2, the transceiver 122 includes components which produce the RF excitation field $B_1$ through power amplifier 123 at a coil 138A and components which receive the resulting MR signal induced in a coil 138B. The base, or carrier, frequency of the RF excitation field is produced by a frequency synthesizer 200 which receives a set of digital signals (CF) through the communications link 103 from the main computer 101. These digital signals indicate the frequency which is to be produced at an output 201 at a resolution of one Hertz. The commanded RF carrier is applied to a modulator 202 where it is frequency and amplitude modulated in response to signals received through line 203, and the resulting RF excitation signal is turned on and off in response to a control signal from the PCM 120 received through line 204. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A.

Referring still to FIGS. 1 and 2 the MR signal produced by the subject is picked up by the receiver coil 138B and applied to the input of a receiver 207. The receiver 207 amplifies the MR signal and this then attenuated by an amount determined by a digital attenuation signal (RA) received from the main computer 101 through link 103. The receiver 207 is also turned on and off by a signal through line 208 from the PCM 120 such that the MR signal is acquired only over the time intervals required by the particular acquisition being performed.

The received MR signal is demodulated by a quadrature detector 209 to produce two signals I and Q that are coupled through filters to a pair of analog to digital converters indicated collectively at 215. These A/D converters are enabled by the control line 208 to produce digitized MR data only when a valid signal is present. This data is output to the main computer 101 through line 105. The filters at the inputs to the A/D converters are controlled by the main computer 101 to limit the bandwidth of I and Q. The quadrature detector 209 also receives an RF reference signal from a second frequency synthesizer 210 and this is employed by the quadrature detector 209 to sense the amplitude of that component of the MR signal which is in phase with the transmitter RF carrier and the amplitude of that component of the MR signal which is in quadrature therewith. The frequency synthesizer 210 receives digital signals (CF) through the link 103 which determine the frequency of the demodulation signal. The phase of the two synthesizers 200 and 210 is locked together through a line 211, and in most measurements, the frequency of the two synthesizers is the same.

The present invention relates to the automatic adjustment of the RF carrier frequency produced by the synthesizers 200 and 210 in the transceiver 122. This RF frequency must be precisely set in order to provide optimal results from the MR scanner. The optimal RF frequency usually changes from scan to scan, and the present invention is implemented routinely at the beginning of each scan as part of a "prescan" sequence in which other system parameters are also adjusted, or calibrated. One such adjustment, for example, is described in copending U.S. patent application Ser. No. 907,519 which was filed on Sept. 15, 1986, and which is entitled "Automatic Transmit and Receive Attenuation Prescaling In Nuclear Magnetic Resonance Scanner." The prescan sequence is executed by the main computer 101 in response to a set of stored program instructions and it produces the digital signals CF, TA and RA which are employed to operate the transceiver 122 as described above.

Figure 3:
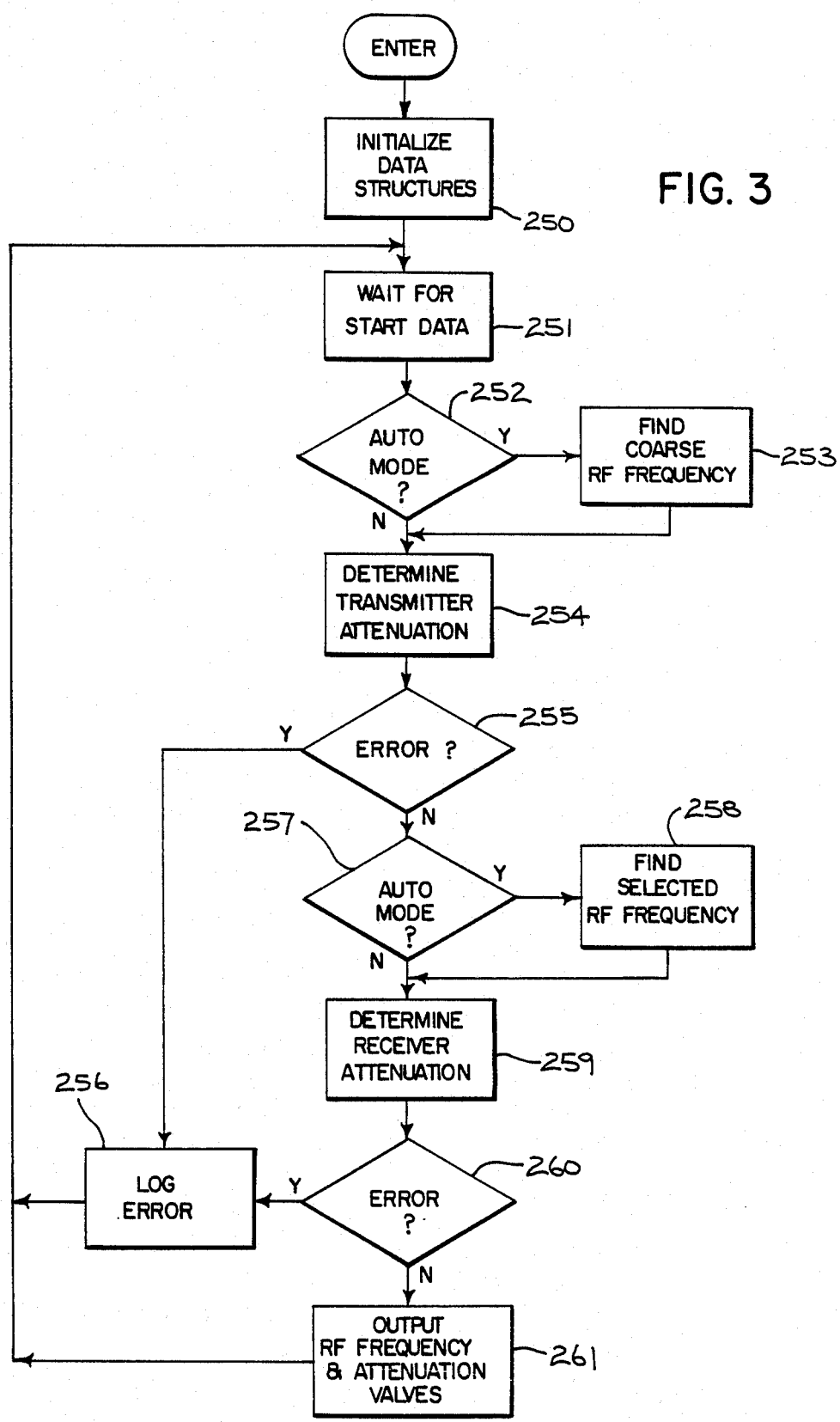
FIG. 3 is a flow chart of the prescan program which is executed by the MR system of FIG. 1.

Referring to FIG. 3, the prescan sequence is entered and the various data structures which it requires are initialized as indicated at process block 250. A loop is then entered at process block 251 in which the prescan waits for a call from the main scan program. The main scan program provides data to the prescan, such as, the location of the center of the region of interest where the scan is to acquire MR data. A test is then made at decision block 252 to determine if the operator has chosen the automatic frequency adjust mode of operation. If not, the prescan continues to perform its other functions and it is presumed that the operator is satisfied with the current frequency setting or intends to manually adjust the RF frequency after the automatic prescan and prior to the scan. Otherwise, a first, broadband, MR measurement is performed to coarsely determine the proper RF frequency as indicated by process block 253. As will be explained in more detail below, this measurement employs the MR signal to detect the frequency of its peak amplitude and this frequency is output ($CF_1$) to the transceiver 122. The optimal transmitter attenuation (TA) is then calculated at process block 254 in accordance with the teachings in the above-cited copending U.S. patent application. If either the carrier frequency ($CF_1$) or the transmitter attenuation (TA) cannot be determined automatically, this is detected at decision block 255 and the process branches to log the error at 256 for display to the operator.

Referring still to FIG. 3, if the automatic frequency adjustment mode has been selected, the system branches at decision block 251 and a second, narrowband, MR measurement is performed at process block 258 to determine the exact RF frequency setting ($CF_2$). As will be explained in more detail below, this second measurement and the subsequent analysis of the MR signal employs data which has been input by the operator through the console 116 (FIG. 1). More specifically, the RF frequency may be set to any one of the following frequencies:

WATER—the Larmor frequency of the nuclei associated with water molecules;
FAT—the Larmor frequency of the nuclei associated with fat molecules;
MIDPOINT—a frequency midway between the WATER and FAT Larmor frequencies;
PEAK—the frequency which produces the largest peak in the transformed MR signal; and
CENTROID—weighted center frequency of the transformed MR signal.

After determining one of these selected frequencies the prescan process determines at process block 259 the receiver attenuation setting (RA). If either $CF_2$ or RA cannot be determined, the system branches at decision block 260 to indicate an error. Otherwise, the main computer 101 outputs the calculated values $CF_2$, TA and RA to the transceiver 122 as indicated at 261. The pre-scan process then loops back to block 251 and waits for another call from the main scan program. Of course, the main scan program now proceeds to perform the programmed scan with the transceiver 122 finely tuned to the selected RF frequency.

The determination of the optimal RF frequency for the particular scan to be performed requires the execution of two MR measurements. The first of these is illustrated by the pulse sequence in FIG. 4 which is executed as part of the procedure for finding the coarse frequency $CF_1$. The second MR measurement is illustrated by the pulse sequence in FIG. 5 which is executed as part of the procedure for finding the exact RF frequency $CF_2$. These pulse sequences are orchestrated in the standard manner by the pulse control module 120 (FIG. 1) under the direction of the prescan program as described above.

Figure 4:
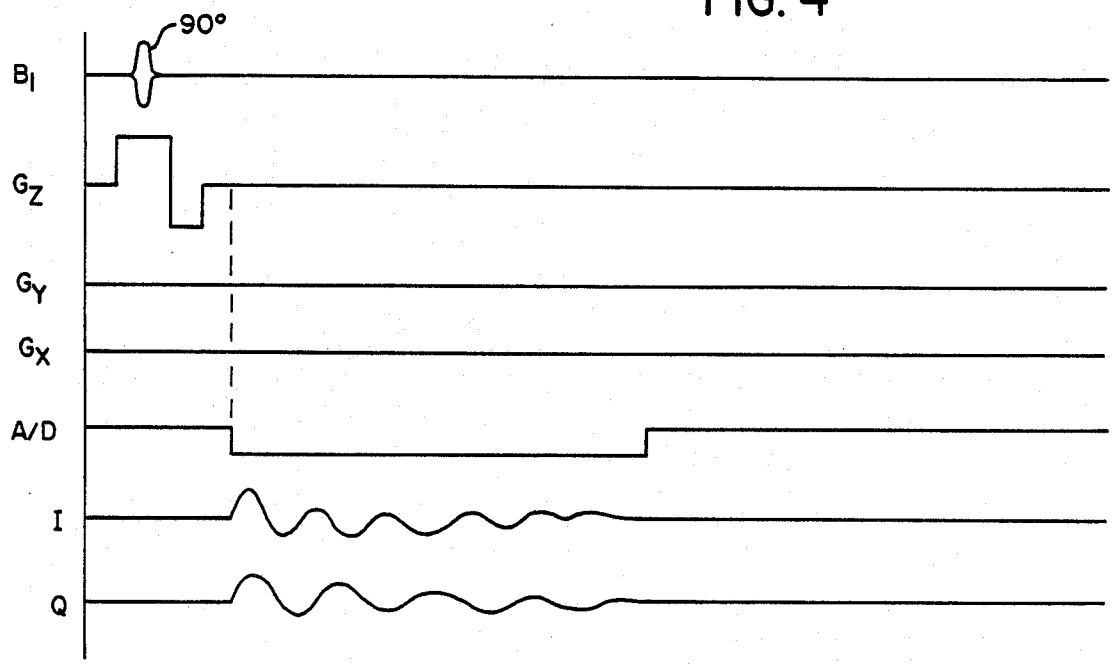
FIG. 4 is a graphic illustration of an MR measurement pulse sequence which is performed as part of the prescan.

Referring to FIG. 4, the coarse pulse sequence begins by exciting the spins in a selected slice through the center of the region of interest. This is accomplished in standard fashion with a 90° excitation pulse produced while a gradient $G_z$ is applied. The $G_z$ gradient is then reversed to rephase the spins and the A/D converter is enabled to acquire the MR signal. This signal is demodulated and its quadrature phases I and Q are acquired. In the preferred embodiment the signals I and Q are digitized at a 4 kHz sampling rate and 256 samples are acquired. These samples represent the magnitude of the components of the MR signal as a function of time and they are stored in the computer system as a file $S(t) = S_I(t) + jS_Q(t)$. Together these signals also indicate the phase of the MR signal. The file $S(t)$ is then transformed to the frequency domain using a fast-Fourier transformation of the complex data. The transformed data is stored as a file $F(f) = F_i(f) + jF_q(f)$. The magnitude of the transformed signal $F_f$ is then calculated:

$$|F(f)| = \sqrt{F_i^2(f) + F_q^2(f)}$$

and the resulting transformed signal $|F(f)|$ is smoothed by digitally filtering out higher frequency components as disclosed in "Numerical Recipes" by William H. Press et al. and published in 1986 by Cambridge University Press, pp. 495–497. This transformed signal is graphically represented in FIG. 6, although it can be appreciated that the precise shape of this waveform will differ with each MR measurement.

Figure 6:
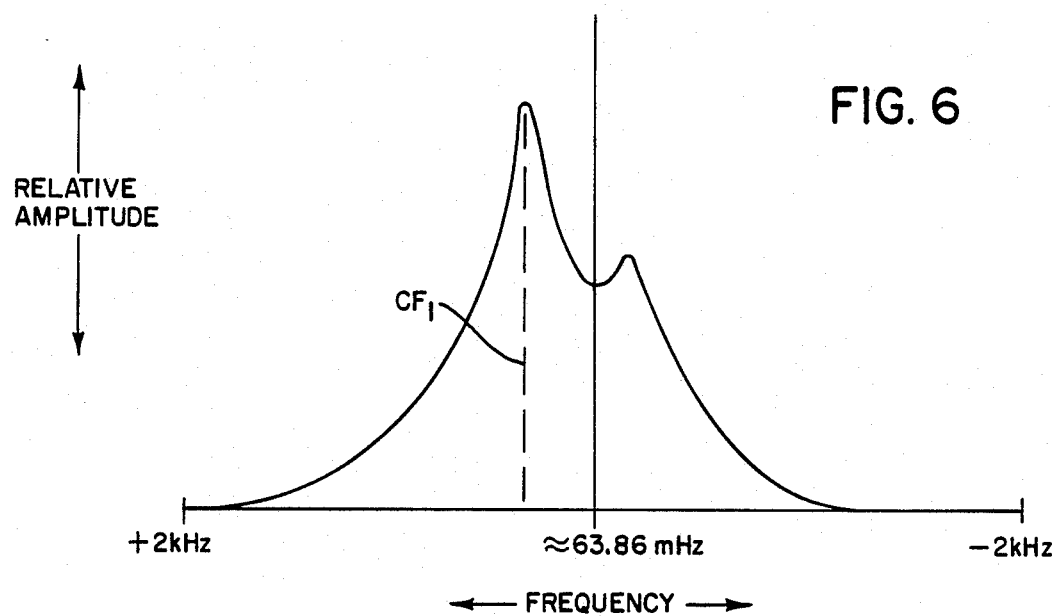
FIG. 6 is a graphic illustration of a transformed MR signal which results from the MR measurement of FIG. 4.

Referring particularly to FIG. 6, the transformed MR signal is now analyzed to determine the frequency of the highest peak. This is accomplished by taking the derivative of transformed MR signal and identifying those frequencies at which the derivative changes from a positive to negative sign. The magnitude of the signal is then measured at each of these frequencies to determine the frequency of the highest peak. This frequency is returned as the first pass, or coarse, RF frequency $CF_1$ which is output to the transceiver 122. The RF frequency has now been set so that a higher resolution MR measurement can be performed during the second pass.

Figure 5:
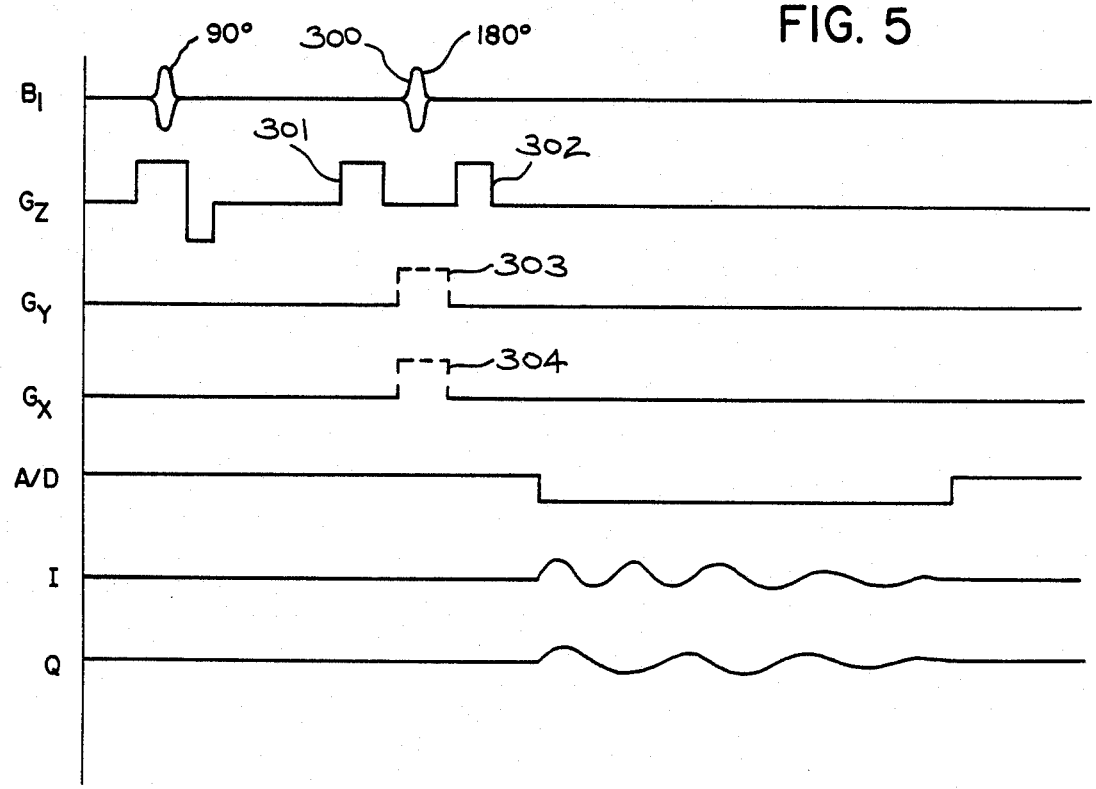
FIG. 5 is a graphic illustration of a second MR measurement pulse sequence which is performed as part of the prescan.

The pulse sequence for the second MR measurement which is performed during the second pass adjustment of the RF frequency is shown in FIG. 5. In addition to a slight change in the RF frequency of the excitation field $B_1$ as a result of the first pass adjustment, a number of other differences exist in this second MR measurement. After the selected slice is excited and rephased by the ninety degree $B_1$ pulse and the $G_z$ pulses, the excited spins are tipped 180° by a second excitation pulse 300 which is produced midway between two $G_z$ gradient pulses 301 and 302. As a result, when the A/D converter is subsequently turned on the MR signal which is acquired is an echo pulse. In addition, by applying gradient pulses in either the Y or X direction as indicated at 303 and 304, this MR signal can be further position encoded to a specific region within the selected slice. This is particularly useful where there is considerable tissue in the selected slice along one of these axes, but outside the region of interest. If not eliminated by position encoding, such tissue will effect the MR signal and may result in a less than optimal RF frequency for the MR scan of the region of interest. Because these position encoding gradient pulses are optional, they are indicated by dashed lines in FIG. 5, however, the system does automatically apply position encoding gradient pulses along the dimension thought to have the most tissue.

During the second MR measurement the I and Q signals which are output by the quadrature detector 209 (FIG. 2) are sampled and digitized at a 1 kHz sample rate. Two hundred and fifty-six such digitized samples are obtained and are processed as described above to produce a file $|F(f)|$ containing the magnitude of the transformed and filtered MR signal. The graphic representation of this transformed MR signal is shown in FIG. 7 and it can be seen that because of the lower sampling rate a much narrower frequency range is covered.

Figure 7:
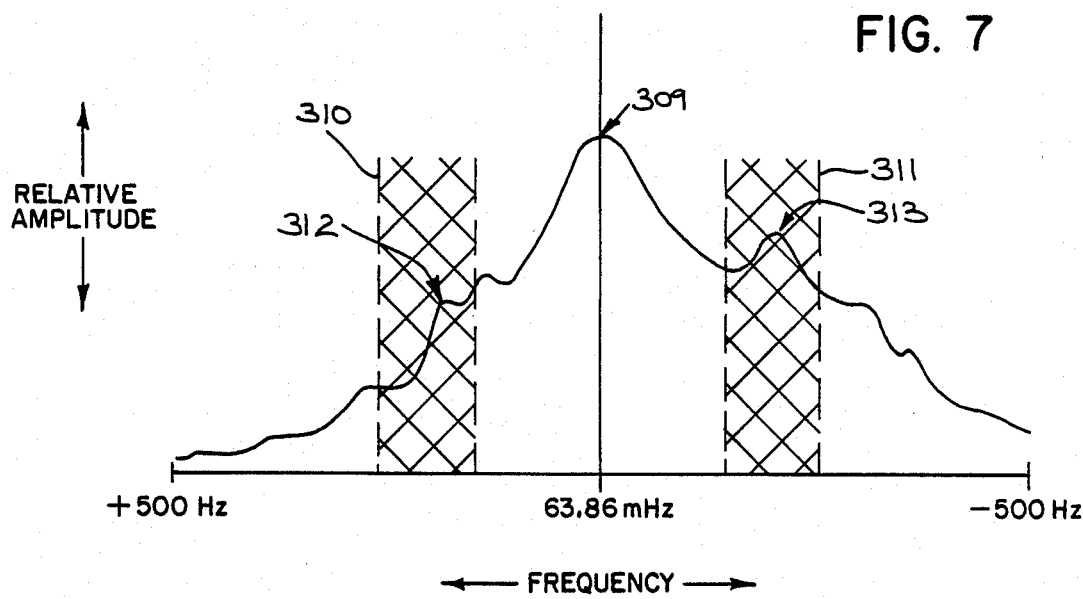
FIG. 7 is a graphic illustration of a transformed MR signal which results from the MR measurement of FIG. 5.
Figure 8:
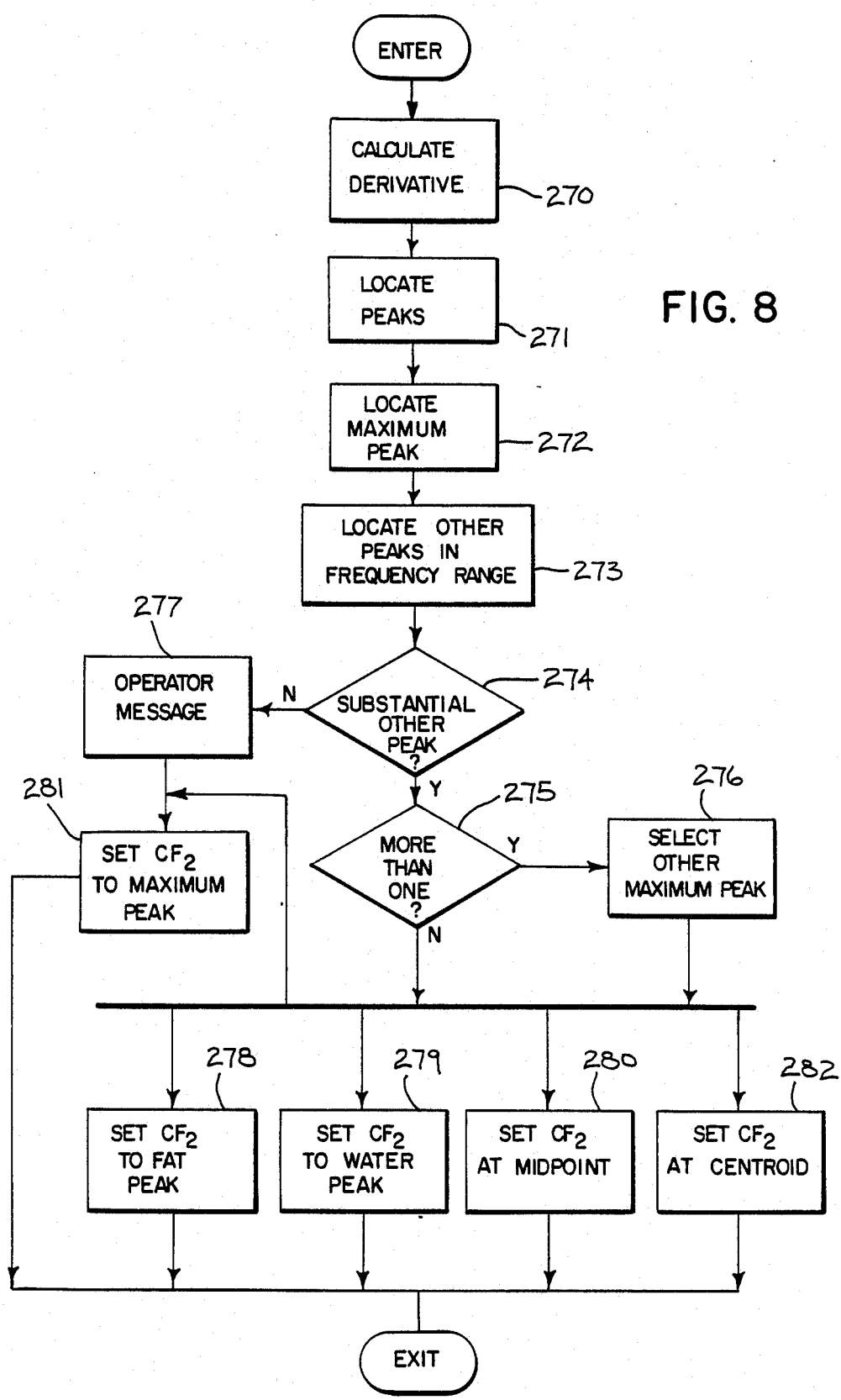
FIG. 8 is a flow chart showing in more detail a portion of the prescan program of FIG. 3.

Referring particularly to FIGS. 7 and 8, the transformed MR signal is now analyzed to determine the optimal, selected RF frequency. First, the peaks in the waveform are found by taking the derivative of the stored signal $|F(f)|$ as indicated at 270, and identifying the frequencies at which the derivative changes from plus to minus as indicated at process bock 271. The maximum amplitude peak is then found by examining the amplitude at each frequency where a peak was found as indicated at process block 272.

Next, the other peak in the transformed MR signal due to fat or water nuclei is located. This is accomplished at process block 273 by identifying all substantial peaks which lie within the range of 180 Hz to 240 Hz to either side of the maximum peak. This range is indicated in FIG. 7 by the cross-hatched areas 310 and 311. To be considered substantial, a peak must have a significant amplitude (at least 10% to 20% of the amplitude of the maximum). In the example of FIG. 7, two peaks 312 and 313 satisfy this criteria, however, if none are found, the system branches at decision block 274. When more than one other peak is found, as determined at decision block 275, the choice is made at process block 276 by selecting the peak 313 which has a higher amplitude. Having identified the two peaks, the peak with the higher frequency is assumed to be WATER and the other peak is assumed to be FAT. If a valid peak pair is not found, the process returns the frequency of the maximum peak and it produces a message for the operator at 277.

Once the FAT and WATER peaks have been located, the selected RF frequency is determined and returned as $CF_2$. If the operator has selected FAT or WATER, then no further calculation is required at respective process blocks 278 or 279. If MIDPOINT has been selected, then the frequency half way between the frequency of the FAT and WATER peaks is calculated and output at process block 280. If PEAK has been selected, then the magnitudes of the FAT and WATER peaks are compared and the frequency of the larger peak is returned as indicated at process block 281.

When the operator has chosen CENTROID as the desired RF frequency, a more complex computation is required at process block 282. More specifically, the waveform of the transformed MR signal in FIG. 7 is viewed as a function F(f), where f is the frequency and it ranges from −500 to +500. Then the centroid frequency $f_c$ is calculated as follows:

$$f_c = \int_{-500}^{500} f|F(f)|df / \int_{-500}^{500} |F(f)|df$$

This calculated frequency $f_c$ is returned as the optimal RF frequency $CF_2$.

In the MR scanner which is employed in the preferred embodiment, the transceiver RF frequency may be controlled either manually or by digital command signals from the main computer 101. The present invention exploits this capability by performing an automatic prescan sequence prior to each scan of a patient. This prescan determines the optimal RF frequency for the scan and outputs a digital command $CF_2$ to set the RF frequency of the transceiver. The operator maintains control over this automatic frequency calibration by selecting any one of four automatic frequency settings at the main operator console 116. Of course, the operator can also disable the automatic mode and set the RF frequency manually as has been done in the past. In addition, the operator can elect to perform a semiautomatic calibration of the RF frequency in which the broadband MR measurement is performed and the transformed MR signal is displayed on the operator console 116. The operator manually sets $CF_1$ and the second, narrowband MR measurement is run using this RF frequency. The transformed MR data from the second measurement is displayed on the operator console 116 and the operator manually selects the desired RF frequency $CF_2$.

Many variations are possible from the preferred embodiment described herein without departing from the spirit of the invention. For example, each MR measurement may, in fact, be comprised of two pulse sequences as shown and described herein. The ninety degree excitation pulses in the two sequences are out of phase 180 degrees and the two MR signals are subtracted from each other to eliminate baseline errors in the system. Also, although a ninety degree excitation pulse is employed in the preferred embodiment, this is not critical. Any amount of transverse magnetization which will produce an MR signal is satisfactory, and excitation pulses ranging from thirty to one hundred and fifty degrees will operate satisfactorily. OF course, the 180 echo pulse 300 must be of sufficient accuracy to produce an echo signal as is well known in the art.

I claim:

1. A method for automatically adjusting the RF frequency of a transceiver in an MR scanner system, which comprises:
   performing a first MR measurement in which an MR signal is produced and acquired;
   transforming the acquired MR signal to the frequency domain;
   determining the frequency $CF_1$ at which the transformed MR signal reaches its maximum value;
   performing a second MR measurement with an RF excitation pulse having a frequency substantially equal to $CF_1$ to produce a second MR signal;
   acquiring the second MR signal;
   transforming the second MR signal to the frequency domain;
   analyzing the second transformed MR signal to determine the Larmor frequencies for FAT and WATER as indicated by a pair of peaks therein; and
   outputting to the transceiver on the MR scanner system an RF frequency command $CF_2$ which is based on the determined WATER or FAT Larmor frequency.

2. The method as recited in claim 1 which includes:
   applying a magnetic field gradient during each MR measurement to localize the source of the MR signals to a selected region of interest.

3. The method as recited in claim 1 which includes:
   inputting a manual selection which indicates the desired RF frequency with respect to the Larmor frequency of WATER or FAT; and
   calculating the RF frequency command $CF_2$ based on the manually selectable RF frequency and the measured Larmor frequency of FAT or WATER.

4. The method as recited in claim 3 in which the manually selectable RF frequencies include the Larmor frequency of FAT, the Larmor frequency of WATER, and a frequency at the midpoint between the Larmor frequency of FAT and the Larmor frequency of WATER.

5. The method as recited in claim 3 in which the manually selected RF frequencies include the Larmor frequency of which of either FAT or WATER that produces the largest MR signal amplitude.

6. The method as recited in claim 1 in which the analyzing of the second transformed MR signal to determine the Larmor frequencies for FAT and WATER includes the steps of:
   (a) differentiating the second transformed MR signal;
   (b) identifying peak frequencies at which the differentiated signal changes sign; and
   (c) identifying a pair of said peak frequencies which are within a predetermined range of frequencies from each other.

7. In an MR scanner having a transceiver for producing RF excitation pulses at a frequency controlled by a frequency command signal from a processor to conduct an MR measurement in which an MR signal is received by the transceiver and coupled to the processor, the improvement therein comprising:
   means coupled to the processor for conducting a first MR measurement and acquiring a first MR signal which results therefrom;
   means coupled to the processor for analyzing the first MR signal to determine the frequency $CF_1$ which produces the maximum signal magnitude;
   means coupled to the processor for conducting a second MR measurement in which the frequency command signal applied to the transceiver is set at substantially the value of $CF_1$;

means coupled to the processor for receiving a second MR signal which results from the second MR measurement;

means coupled to the processor for analyzing the acquired second MR signal to determine the frequencies of the peaks therein which indicate the Larmor frequencies of FAT and WATER; and means coupled to the processor for producing a second frequency command signal to the transceiver having a value $CF_2$ which is determined relative to the measured Larmor frequency of FAT or WATER.

8. The improvement as recited in claim 7 in which the value $CF_2$ is set substantially at the Larmor frequency of WATER.

9. The improvement as recited in claim 7 in which the value of $CF_2$ is set substantially at the Larmor frequency of FAT.

10. The improvement as recited in claim 7 which includes manually operable means for selecting one of a plurality of values of $CF_2$ relative to the measured Larmor frequencies of FAT and WATER.

11. The improvement as recited in claim 10 in which the plurality of selectable values of $CF_2$ includes
 the Larmor frequency of FAT;
 the Larmor frequency of WATER; and
 a frequency midway between the measured Larmor frequencies of FAT and WATER.

12. A method for automatically adjusting the RF frequency of a transceiver in an MR scanner system, which comprises:

performing a first MR measurement in which an MR signal is produced and acquired;

transforming the acquired MR signal to the frequency domain;

determining the frequency $CF_1$ at which the transformed MR signal reaches its maximum value;

performing a second MR measurement with an RF excitation pulse having a frequency substantially equal to $CF_1$ to produce a second MR signal;

acquiring the second MR signal;

transforming the second MR signal to the frequency domain to provide a signal having an amplitude $F(f)$ over a frequency range $f^+$ to $f^-$;

calculating the CENTROID frequency $f_c$ of the transformed second MR signal $F(f)$ in accordance with the following expression:

$$f_c = \int_{f^-}^{f^+} f|F(f)|df / \int_{f^-}^{f^+} |F(f)|df;$$

outputting to the transceiver on the MR scanner system an RF frequency command $CF_2$ which is based on the CENTROID frequency $f_c$.

13. The method as recited in claim 12 which includes:
applying a magnetic field gradient during each MR measurement to localize the source of the MR signals to a selected region of interest.

* * * * *